United States Patent
Huang

(10) Patent No.: US 11,215,877 B2
(45) Date of Patent: Jan. 4, 2022

(54) DISPLAY APPARATUS AND DISPLAY DEVICE

(71) Applicants: CHONGQING HKC OPTOELECTRONICS TECHNOLOGY CO., LTD., Chongqing (CN); HKC CORPORATION LIMITED, Guangdong (CN)

(72) Inventor: Shishuai Huang, Chongqing (CN)

(73) Assignees: CHONGQING HKC OPTOELECTRONICS TECHNOLOGY CO., LTD., Chongqing (CN); HKC CORPORATON LIMITED, Shenzhen (CN)

( * ) Notice: Subject to any disclaimer, the term of this patent is extended or adjusted under 35 U.S.C. 154(b) by 61 days.

(21) Appl. No.: 16/312,813

(22) PCT Filed: Nov. 14, 2018

(86) PCT No.: PCT/CN2018/115404
§ 371 (c)(1),
(2) Date: Dec. 21, 2018

(87) PCT Pub. No.: WO2020/062480
PCT Pub. Date: Apr. 2, 2020

(65) Prior Publication Data
US 2020/0103684 A1    Apr. 2, 2020

(30) Foreign Application Priority Data

Sep. 30, 2018  (CN) .......................... 201821628832.8

(51) Int. Cl.
*H01L 27/12*      (2006.01)
*G02F 1/1339*    (2006.01)
(Continued)

(52) U.S. Cl.
CPC ...... *G02F 1/1339* (2013.01); *G02F 1/133512* (2013.01); *G02F 1/136286* (2013.01); *H01L 27/124* (2013.01); *H01L 29/42364* (2013.01); *H01L 29/42384* (2013.01); *G02F 1/1368* (2013.01); *G02F 1/133514* (2013.01); *G02F 1/136295* (2021.01)

(58) Field of Classification Search
CPC ............. H01L 27/124; H01L 29/42364; H01L 29/42384; G02F 1/1339; G02F 1/133512; G02F 1/136286; G02F 1/1368; G02F 1/133514; G02F 2001/136295
See application file for complete search history.

(56) References Cited

U.S. PATENT DOCUMENTS

2010/0165278 A1* 7/2010 Matsumori ......... G02F 1/13394
                                                      349/123
2015/0197691 A1* 7/2015 Ogawa .............. G02F 1/136286
                                                      349/43
(Continued)

*Primary Examiner* — Thanh T Nguyen

(57) ABSTRACT

According to an embodiment of the present disclosure, it is provided a display apparatus including a first substrate, a second substrate and a sealant. The back surface of the first substrate is provided with a metal wiring. The metal wiring is provided with a hollow-out region. The metal wiring is arranged in a curved shape.

20 Claims, 3 Drawing Sheets

(51) Int. Cl.
  *G02F 1/1362* (2006.01)
  *G02F 1/1335* (2006.01)
  *H01L 29/423* (2006.01)
  *G02F 1/1368* (2006.01)

(56) References Cited

U.S. PATENT DOCUMENTS

2015/0255754 A1* 9/2015 Moon ................ H01L 51/5284
                                                            257/89
2017/0288009 A1* 10/2017 Kim .................... H01L 27/3279
2019/0088685 A1* 3/2019 Huang ................. H01L 27/127

* cited by examiner

DISPLAY APPARATUS AND DISPLAY DEVICE

CROSS-REFERENCES TO RELATED APPLICATIONS

This application is the International Application No. PCT/CN2018/115404 for entry into US national phase with an international filing date of Nov. 14, 2018 designating US, now pending, and claims priority to Chinese Patent Application No. 201821628832.8, filed on Sep. 30, 2018, entitled "display apparatus", the content of which is incorporated hereby by reference in its entirety.

BACKGROUND

Field of the Invention

The present disclosure relates to the field of display technologies, and in particular, to display apparatus and display device.

Description of Related Art

The descriptions herein merely provide background information related to the present disclosure and do not necessarily constitute the prior art.

In recent years, the development of liquid crystal display devices has shown a trend of high integration and low cost. A common display device is usually a thin film transistor liquid crystal display (TFT-LCD). The TFT-LCD is composed of a TFT substrate and a color filter (CF) substrate. The two substrates are bonded together by a sealant. Hollowed-out metal wires are formed on the TFT substrate and the ultraviolet light can pass through to photocure the sealant. After the photocuring is completed, thermocuring of the sealant is required to completely cure the sealant.

Currently the metal wires on the TFT substrate are mostly straight rectangular wires. Such wires are short and have small area, which is not conducive to the scattering of ultraviolet light and the heat conduction, resulting in a low curing rate of the sealant, thereby affecting the bonding effect of the two substrates.

SUMMARY

According to an embodiment of the present disclosure, it is provided a display apparatus, comprising:

a first substrate, wherein one side of the first substrate is a light-incident surface;

a second substrate arranged at and spaced apart from a side of the first substrate opposite to the light-incident surface;

a sealant arranged between the first substrate and the second substrate and configured to fixedly bond the first substrate to the second substrate; and a metal wiring arranged on the other side of the first substrate, wherein the metal wiring is arranged in a curved shape;

wherein the metal wiring is provided with a hollow-out region which is configured to allow light to pass through to cure the sealant.

In an embodiment, the metal wiring comprises a plurality of metal wires spaced apart from each other and a plurality of connecting wires connecting adjacent two of the metal wires, the hollow-out region is formed in a region between adjacent two connecting wires and two of the metal wires connected to both ends of the two connecting wires, and the metal wire has a curved shape.

In an embodiment, the metal wire is corrugated in a direction perpendicular to the first substrate, the plurality of metal wires form corrugated surfaces, and the connecting wire is vertically connected between peak positions or valley positions of adjacent metal wires.

In an embodiment, the metal wire is corrugated inclined with respect to the first substrate, the plurality of metal wires form corrugated surfaces, and the connecting wire is vertically connected between peak positions or valley positions of adjacent metal wires.

In an embodiment, the metal wire is in a zigzag shape that fluctuates in a direction perpendicular to the first substrate, the plurality of metal wires form sawtooth surfaces, and the connecting wire is vertically connected between tip positions or slot positions of adjacent metal wires.

In an embodiment, the metal wire is in a zigzag shape that fluctuates in a direction inclined with respect to the first substrate, the plurality of metal wires form sawtooth surfaces, and the connecting wire is vertically connected between tip positions or slot positions of adjacent metal wires.

In an embodiment, the connecting wires are the same in length.

In an embodiment, along a length direction of the metal wire, vertical distances from points of each of the metal wires to another of the metal wires are equal.

In an embodiment, the second substrate is further coated with a black matrix, and the black matrix is arranged on one surface of the second substrate facing the first substrate.

In an embodiment, the first substrate is further provided with a conductive thin film layer configured to protect the metal wiring.

In an embodiment, the conductive film layer has a thickness greater than or equal to a thickness of the metal wiring.

In an embodiment, the conductive thin film layer is an ITO thin film layer.

According to another embodiment of the present disclosure, it is provided a display apparatus, including:

a first substrate, wherein one side of the first substrate is a light-incident surface;

a second substrate arranged at and spaced apart from a side of the first substrate opposite to the light-incident surface;

a sealant arranged between the first substrate and the second substrate and configured to fixedly bond the first substrate to the second substrate; and a metal wiring arranged on the other side of the first substrate, wherein a portion of the metal wiring corresponding to the sealant is arranged in a curved shape;

wherein the metal wiring is provided with a hollow-out region which is configured to allow light to pass through to cure the sealant;

wherein a gate insulating layer is arranged on the other side of the first substrate, and at least a portion of the metal wiring other than those corresponding to the sealant is arranged in the gate insulating layer.

In an embodiment, the gate insulating layer has a thickness greater than a thickness of the metal wiring.

In an embodiment, the gate insulating layer has a length smaller than a length of the first substrate.

In an embodiment, the metal wiring comprises a plurality of metal wires spaced apart from each other and a plurality of connecting wires connecting adjacent two of the metal wires, the hollow-out region is formed in a region between adjacent two connecting wires and two of the metal wires connected to both ends of the two connecting wires, and the metal wire has a curved shape.

In an embodiment, the metal wires are the same in thickness.

In an embodiment, each of the connecting wires has a thickness greater than a thickness of each of the metal wires.

In an embodiment, the connecting wires are integrally formed with the metal wires.

According to yet another embodiment of the present disclosure, it is provided a display device comprising a display host and a base configured to support the display host, the display host comprising:

a first substrate, wherein one side of the first substrate is a light-incident surface;

a second substrate arranged at and spaced apart from a side of the first substrate opposite to the light-incident surface;

a sealant arranged between the first substrate and the second substrate and configured to fixedly bond the first substrate to the second substrate; and a metal wiring arranged on the other side of the first substrate, wherein the metal wiring is arranged in a curved shape;

wherein the metal wiring is provided with a hollow-out region which is configured to allow light to pass through to cure the sealant.

In an embodiment of the present disclosure, by configuring the metal wiring to a curved shape, the length and the area of the metal wiring can be increased, resulting in the increase of the scattering rate of incident light and the enhancement of the heat conduction capability of metal, thereby improving the curing efficiency of the sealant.

BRIEF DESCRIPTION OF THE DRAWINGS

In order to more clearly illustrate the technical solutions in the embodiments of the present disclosure, the drawings used in the embodiments or the prior art description will be briefly described below. It is obvious that the drawings in the following description are only some embodiments of the present disclosure. To those skilled in the art, other drawings may be obtained from these drawings without paying any creative effort.

DESCRIPTION OF THE EMBODIMENTS

Figure 1:
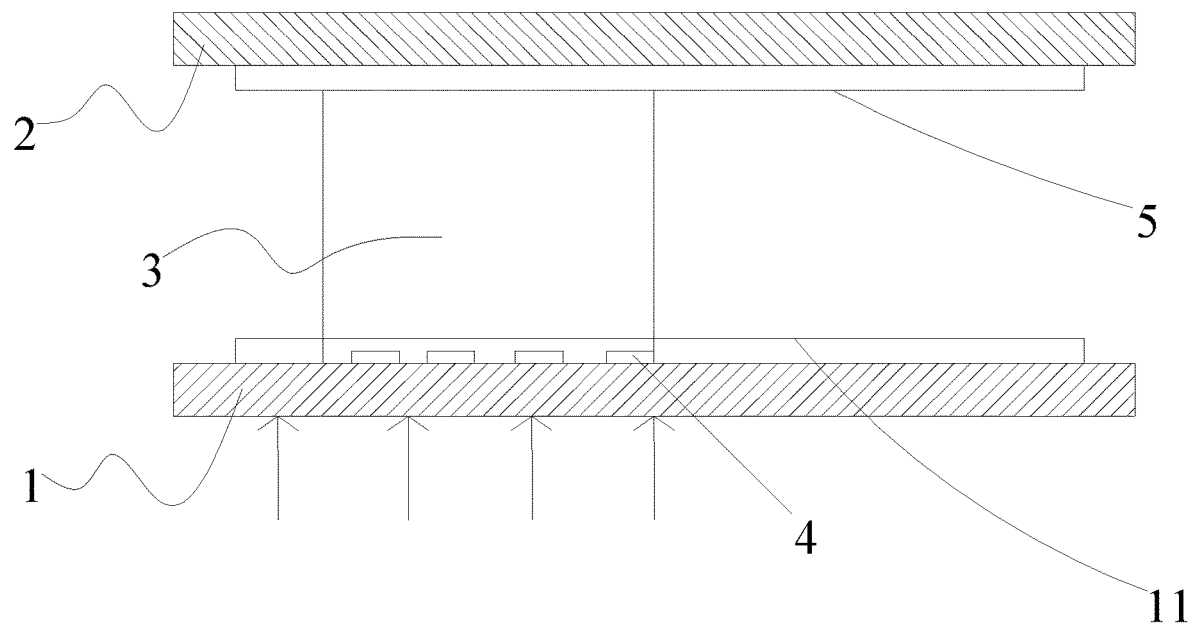
FIG. 1 is a schematic structural view of a display apparatus according to an embodiment of the present disclosure.

The technical solutions in the embodiments of the present disclosure will be clearly described in the following with reference to the accompanying drawings in the embodiments of the present disclosure. It is obvious that the embodiments to be described are just some instead of all embodiments of the present disclosure. All other embodiments obtained by those skilled in the art based on the embodiments of the present disclosure without paying any creative effort should be included within the protection scope of the present disclosure.

The term "comprise" and its variations in the specification, claims and above description of the drawings of the present disclosure are intended to cover non-exclusive inclusions. For example, a process, method or system, product or device including a series of steps or units is not limited to the listed steps or units, but optionally also includes steps or units not listed, or optionally also includes other steps or units inherent to the process, method, product or equipment. Moreover, the terms "first", "second" and "third," etc. are used to distinguish different objects, and are not intended to describe a particular order.

As shown in FIGS. 1 to 6, in an embodiment of the present disclosure, it is provided a display apparatus including a first substrate 1 and a second substrate 2. One side of the first substrate 1 is a light-incident surface and the first substrate 1 is opposite to and spaced apart from the second substrate 2. The first substrate 1 is opposite to the light-incident surface. The display apparatus further includes a sealant 3 which is disposed between the back surface of the first substrate 1 and the second substrate 2. The sealant 3 can be used to fixedly bond the first substrate 1 to the second substrate 2. Metal wiring is formed on the other side of the first substrate 1. The metal wiring 4 is provided with hollow-out regions 41 through which the light can pass to photocure and thermocure the sealant 3. The metal wiring 4 is arranged in a curved shape. By configuring the metal wiring to a curved shape, the length and the area of the metal wiring can be increased, resulting in the increase of the scattering rate of incident light and the enhancement of the heat conduction capability of metal, thereby improving the curing efficiency of the sealant 3.

In an embodiment, the metal wiring 4 is arranged in a curved shape, at least indicating that the metal wiring 4 is a non-planar structure with respect to the first substrate 1, which may be a wavy structure that undulates in a direction perpendicular to the first substrate 1, or may alternatively be a wavy structure inclined at an oblique angle to the first substrate 1. All of the above structures can achieve the purpose of increasing the area of the metal wiring 4, thereby increasing the area of the light transmitting region.

In an embodiment, the first substrate 1 is a TFT substrate, and the second substrate 2 is a CF substrate. Of course, the first substrate 1 and the second substrate 2 may be other substrates, which is not limited here.

In an embodiment, the light may be ultraviolet light. By using the ultraviolet light to irradiate, on one hand the sealant 3 may be photocured, and on the other hand, it is ensured that the crystal structure of the first substrate 1 is not damaged and the performance of the first substrate 1 is not affected.

Figure 2:
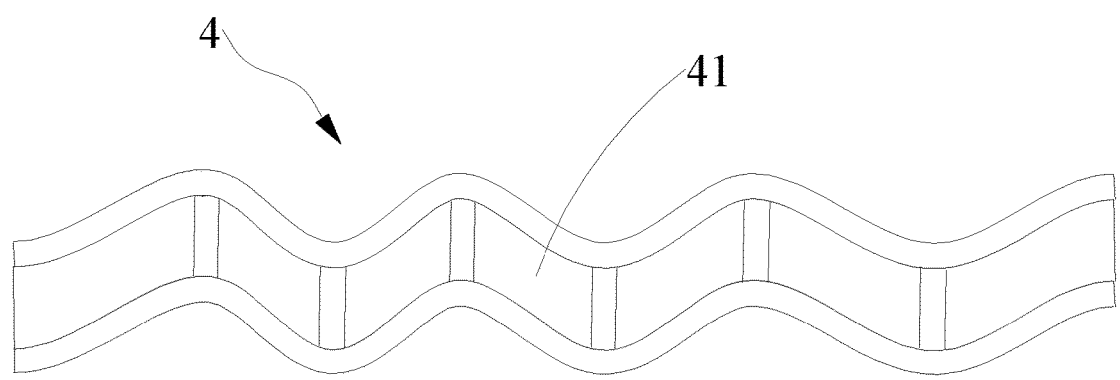
FIG. 2 is a schematic structural view of a metal wiring according to an embodiment of the present disclosure.
Figure 3:
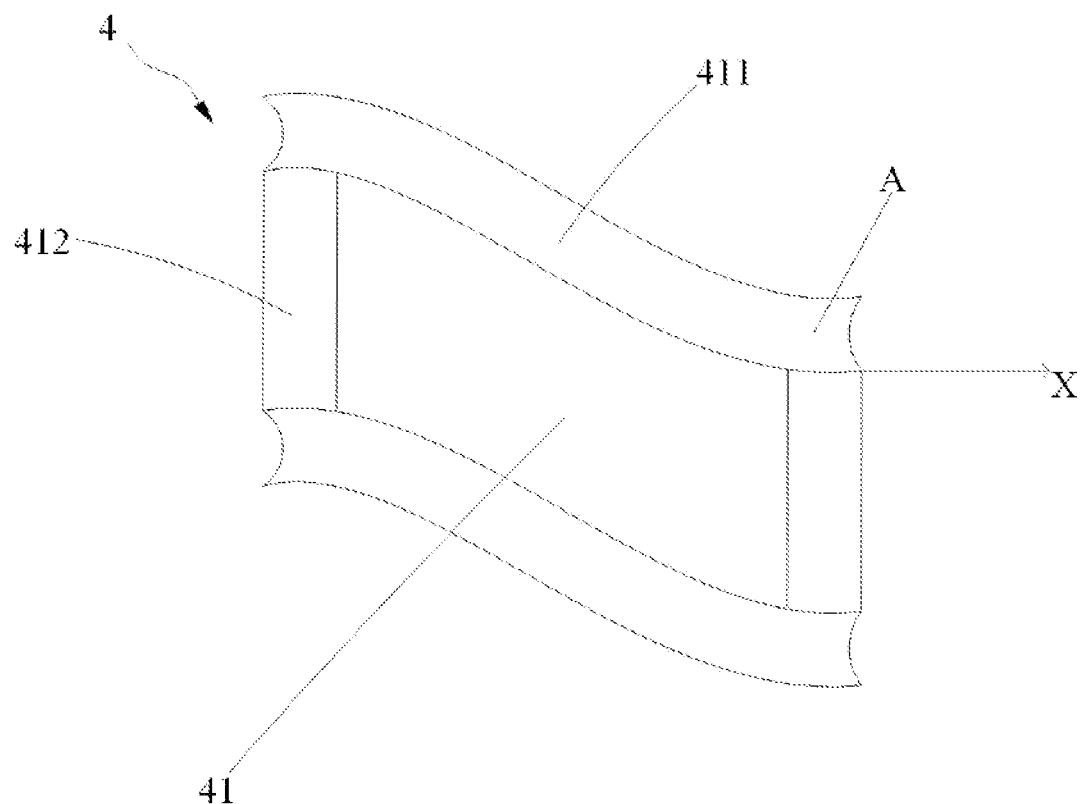
FIG. 3 is a schematic structural view of a hollow-out region according to an embodiment of the present disclosure.

In FIGS. 2 and 3, schematic structural views of a metal wiring are shown by way of example. The metal wire 4 includes a plurality of metal wires 411 and a plurality of connecting wires 412. The metal wires 411 are spaced apart from each other. The connecting wires 412 respectively connect two metal wires 411. Between adjacent two connecting wires 412 and two metal wires 411 a hollow-out region 41 is defined. Each metal wire 411 has a curved shape. Thus, by forming the hollow-out regions 41, the light can pass through to photocure and thermocure the sealant 3. By configuring the metal wire 411 to a curved shape, the length and the area of the metal wiring 4 can be increased, resulting in the increase of the scattering rate of the incident light and the enhancement of the heat conduction capability of the metal, thereby improving the curing efficiency of the sealant 3.

In an embodiment, the lengths of the connecting wires 412 are equal, and the space distance of the hollow-out region 41 is kept constant, so that the problem of low light transmittance, which accordingly affects the curing efficiency of the sealant 3, can be avoided.

In an embodiment, the distances from the points of one metal wire 411 along the length direction of the metal wires 411 to another metal wire 411 are equal, and the space distance of the hollow-out region 41 is kept constant, so that the problem of low light transmittance, which accordingly affects the curing efficiency of the sealant 3, can be avoided.

As shown in FIG. 3, in one embodiment of the present disclosure, in order to better describe the metal wires 411, two end points of the metal wire 411 defining each hollow-out region 41 are respectively named as point A and point B, with the height of the point B being higher than the height of the point A. The two connecting wires 412 are respectively located at the point A and the point B of the metal wire 411.

As shown in FIG. 3, the metal wire 411 is corrugated in a direction perpendicular to the first substrate 1. The plurality of metal wires 411 form corrugated surfaces. The connecting wires 412 are vertically connected between the peak positions or the valley positions of the adjacent metal wires 411. By configuring the metal wires 411 to be corrugated, the length of the metal wiring 4 can be increased. By vertically connecting the connecting wires 412 between the peak positions or the valley positions of adjacent metal wires 411, the area of the metal wiring 4 can be made relatively large. Therefore, the scattering rate of the incident light can be increased and the heat conduction capability of the metal can be enhanced, thereby improving the curing efficiency of the sealant 3. Of course, in this embodiment, the metal wire 411 may alternatively be corrugated in a direction inclined with respect to the first substrate 1, thereby increasing the area of the metal wiring, which is not limited here.

As shown in FIG. 3, with the X-axis in FIG. 3 as a reference line, the point A is the lowest point of the metal wire 411 and the point B is the highest point of the metal wire 411. Thus the area of the region defined by the two connecting wires 412 and the two metal wires 411 is the largest, so that the scattering rate of incident light can be increased, and the heat conduction capability of the metal can be enhanced, thereby improving the curing efficiency of the sealant 3. Of course, according to the actual situation and specific needs, the point A and the point B may alternatively be set at other positions, which is not limited here.

Figure 4:
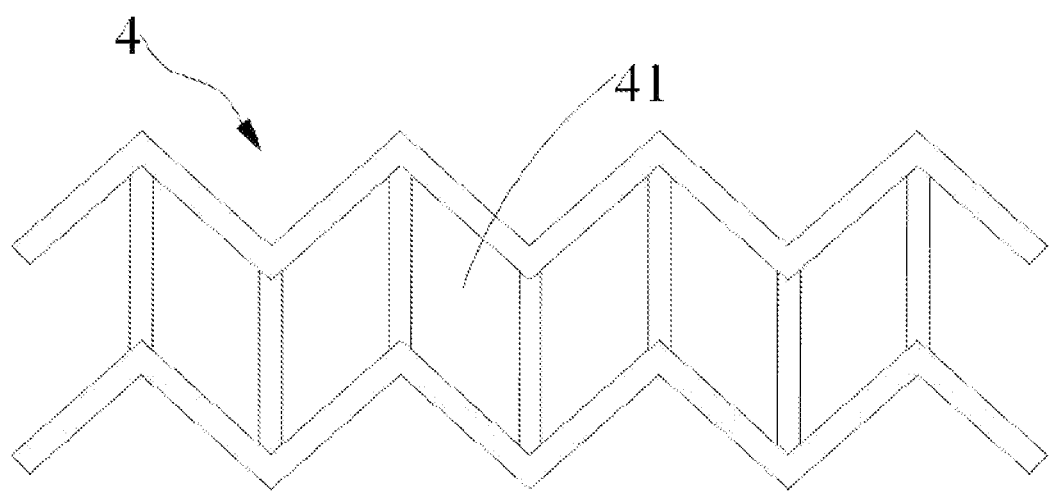
FIG. 4 is a schematic structural view of another metal wiring according to an embodiment of the present disclosure.

As shown in FIG. 4, the metal wire 411 is in a zigzag shape that fluctuates in a direction perpendicular to the first substrate 1. The plurality of metal wires 411 form sawtooth surfaces. Further, the connecting wires 412 are vertically connected between the tip positions or the slot positions of the adjacent metal wires 411. By configuring the metal wires 411 to a zigzag shape, the length of the metal wiring 4 can be increased. By vertically connecting the connecting wires 412 between the tip positions or the slot positions of the adjacent metal wires 411, the area of the metal wiring 4 can be made relatively large. Therefore, the scattering rate of the incident light can be increased and the heat conduction capability of the metal can be enhanced, thereby improving the curing efficiency of the sealant 3. Of course, in this embodiment, the metal wire 411 may alternatively be in a zigzag shape that fluctuates in a direction inclined with respect to the first substrate 1, thereby increasing the area of the metal wiring 4, which is not limited here.

In an embodiment of the present disclosure, it is provided a display apparatus including a first substrate 1 and a second substrate 2. One side of the first substrate 1 is a light-incident surface and the first substrate 1 is opposite to and spaced apart from a side the second substrate 2. The first substrate 1 is opposite to the light-incident surface. The display apparatus further includes a sealant 3 which is disposed between the back surface of the first substrate 1 and the second substrate 2. The sealant 3 can be used to fixedly bond the first substrate 1 to the second substrate 2. Metal wiring 4 is formed on the other side of the first substrate 1. The metal wiring 4 is formed with hollow-out regions 41 through which the light can pass to photocure and thermocure the sealant 3. The metal wiring 4 is arranged in a curved shape. A gate insulating layer 11 is further arranged on the other side of the first substrate 1, and the metal wiring 4 is formed in the gate insulating layer 11. By configuring the metal wiring to a curved shape, the length and the area of the metal wiring 4 can be increased, resulting in the increase of the scattering rate of the incident light and the enhancement of the heat conduction capability of the metal, thereby improving the curing efficiency of the sealant 3. Further, by forming the metal wiring 4 in the gate insulating layer 11, it is possible to prevent the metal wirings 4 from interfering with each other and affecting the conductive signal.

In an embodiment, the thickness of the gate insulating layer 11 is greater than the thickness of the metal wiring 4, so that the metal wiring 4 can be completely covered by the gate insulating layer 11 to better protect the metal wiring 4 and prevent adjacent metal wirings 4 from interfering with each other. Of course, in this embodiment, the thickness of the gate insulating layer 11 may be equal to the thickness of the metal wiring 4, which is not limited here.

In an embodiment, the gate insulating layer 11 is bonded to the first substrate 1 so that the gate insulating layer 11 can be quickly connected to the first substrate 1 and subsequently removed from the first substrate 1. Of course, in this embodiment, the gate insulating layer 11 may be alternatively arranged on the first substrate 1 by coating or the like, which is not limited here.

In an embodiment, the length of the gate insulating layer 11 is smaller than the length of the first substrate 1. Thus, by configuring the first substrate 1 to be longer than the gate insulating layer 11, it is ensured that the first substrate 1 has sufficient space to carry the gate insulating layer 11. Of course, in this embodiment, the length of the gate insulating layer 11 may alternatively be equal to the length of the first substrate 1, which is not limited herein.

In an embodiment, each of the metal wires 411 has the same thickness. Thus, the influence of the thickness unevenness of each metal wire 411 on the transmittance of the light, which accordingly affects the curing efficiency of the sealant 3, can be avoided. In addition, by configuring the thicknesses of the metal wires 411 to be equal, the uniformity of the heat conduction capability of the metal wires 411 is ensured, which is beneficial to the curing of the sealant 3 in the later stage.

In an embodiment, the thickness of the connecting wire 412 is greater than the thickness of the metal wire 411, so that the metal wire 411 can be better supported by the connecting line 412. Of course, in this embodiment, the thickness of the connecting wire 412 may alternatively be less than or equal to the thickness of the metal wire 411, which is not limited here.

In an embodiment, the connecting wires 412 are integrally formed with the metal wires 411. Thus, by the integral formation, the bonding force between the connecting wires 412 and the metal wires 411 can be enhanced, and the service life of the connecting wires 412 and the metal wires 411 can be improved. Of course, in this embodiment, the connecting wires 412 may be soldered to the metal wires 411, which are not uniquely limited here.

In an embodiment, the connecting wires 412 are parallel to each other. By arranging the connecting wires 412 in parallel with each other, it is ensured that the metal wires 412 can better supported by the connecting wires 411.

As shown in FIG. 1, the second substrate 2 is further coated with a black matrix 5 arranged on one side of the second substrate 2 facing the first substrate 1. The black matrix can, on one hand, shield the light from the backlight source, and serve as a transition area between the display area and the surrounding mechanical metal frame to improve the visual effect. On the other hand, the black matrix can also prevent external light from illuminating the semiconductor layer material having photosensitive characteristics on the TFT channel, causing an increase in photo-generated current, that is, TFT leakage current, which causes the TFT to fail to turn off and affects the performance of the display apparatus.

In an embodiment, the black matrix 5 is bonded to the second substrate 2, so that the black matrix 5 and the second substrate 2 can be quickly connected with each other. Of course, in this embodiment, the black matrix 5 may be arranged on the second substrate 2 by coating or the like, which is not limited here.

In an embodiment, after the first substrate 1 and the second substrate 2 are accurately aligned with each other in a vacuum environment, the sealant 3 needs to be ultraviolet-cured immediately to prevent the liquid crystal from coming into contact with the sealant 3, causing liquid crystal contamination or leakage. By configuring the metal wiring 4 on the first substrate 1 to a wave shape, the length and the area of the wiring is increased, and the curing rate of the sealant 3 is accordingly improved. By arranging the sealant 3, the silicon ball particles or plastic ball particles distributed in the sealant 3 serve to support and maintain the thickness of the periphery of the liquid crystal box.

Figure 5:
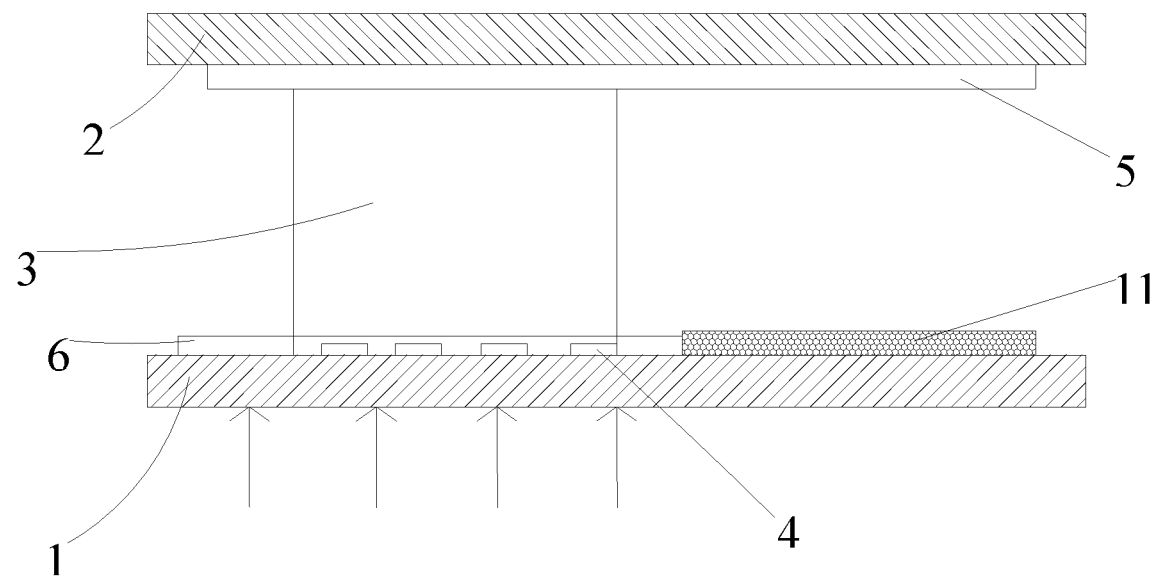
FIG. 5 is a schematic structural view of a display apparatus according to another embodiment of the present disclosure.

As shown in FIG. 5, a conductive thin film layer 6 is further arranged on the back surface of the first substrate 1 and the metal wiring 4 is etched in the conductive film layer 6. Specifically, the gate insulating layer 11 covering the metal wiring 4 in the previous embodiment is dry etched out by dry etching, thus the metal wiring 4 can be protected by the conductive thin film layer 6, replacing the gate insulating layer 11. By providing the conductive thin film layer 6, the thermal conductivity of the metal wiring 4 can be increased, and the curing rate of the sealant 3 can be improved.

In an application, the conductive thin film layer 6 is an Indium Tin Oxide (ITO) thin film layer. Of course, it may alternatively be other thin film layer, which is not limited here.

In an application, the thickness of the conductive thin film layer 6 is greater than the thickness of the metal wiring 4, so that the metal wiring 4 can be well protected. Of course, the thickness of the metal wiring structure 4 may alternatively be equal to the thickness of the conductive thin film layer 6 according to actual situations and specific requirements, which is not limited here.

In an application, the conductive thin film layer 6 is bonded to the first substrate 1. Of course, in this embodiment, the conductive thin film layer 6 may alternatively be arranged on the first substrate 1 by coating, hot pressing or the like, which is not limited here.

Figure 6:
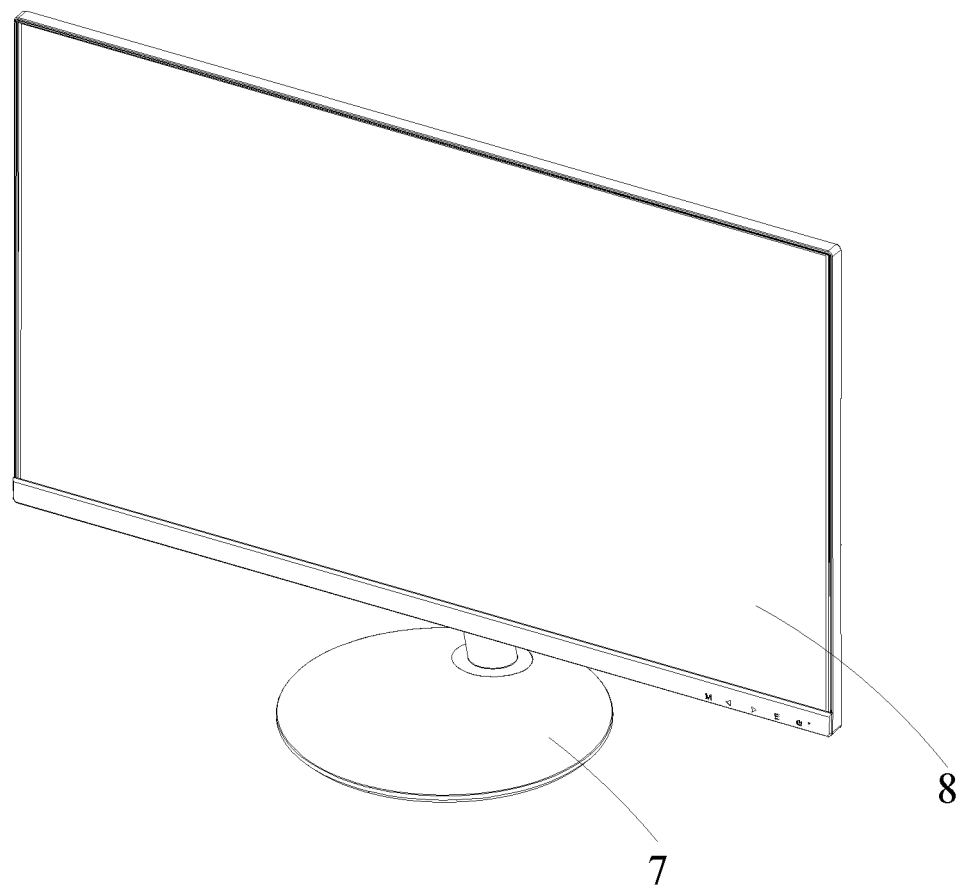
FIG. 6 is a schematic structural view of a display device according to an embodiment of the present disclosure.

According to an embodiment of the present disclosure, it is provided a display device. As shown in FIGS. 1 and 6, the display device includes a display host 8 and a base 7 which may be used to support the display host 8. The display host 8 includes a first substrate 1 and a second substrate 2. One side of the first substrate 1 is a light-incident surface and the first substrate 1 is opposite to and spaced apart from a side the second substrate 2. The first substrate 1 is opposite to the light-incident surface. The display apparatus further includes a sealant 3 which is disposed between the back surface of the first substrate 1 and the second substrate 2. The sealant 3 can be used to fixedly bond the first substrate 1 to the second substrate 2. Metal wiring is formed on the other side of the first substrate 1. The metal wiring 4 is formed with hollow-out regions 41 through which the light can pass to photocure and thermocure the sealant 3. The metal wiring 4 is arranged in a curved shape. By configuring the metal wiring to a curved shape, the length and the area of the metal wiring can be increased, resulting in the increase of the scattering rate of incident light and the enhancement of the heat conduction capability of metal, thereby improving the curing efficiency of the sealant 3.

The above description is only some optional embodiments of the present disclosure, and is not intended to limit the present disclosure. Any modifications, equivalent substitutions and improvements made within the spirit and principles of the present disclosure should be included in the protection scope of the present disclosure.

What is claimed is:

1. Display apparatus, comprising:
   a first substrate, wherein one side of the first substrate is a light-incident surface;
   a second substrate arranged at and spaced apart from a side of the first substrate opposite to the light-incident surface;
   a sealant adhesively and only arranged in periphery portions of the first substrate and the second substrate to seal the first substrate and the second substrate, wherein silicon ball particles or plastic ball particles are distributed in the sealant to support and maintain a liquid box formed by the first substrate and the second substrate; and
   a metal wiring arranged on the other side of the first substrate, wherein the metal wiring is arranged in a curved shape, the metal wiring is a non-planar structure with respect the first substrate, which is a wavy structure that undulates in a direction perpendicular to the first substrate;
   wherein the metal wiring is provided with a hollow-out region which is configured to allow light to pass through to cure the sealant.

2. The display apparatus of claim 1, wherein the metal wiring comprises a plurality of metal wires spaced apart from each other and a plurality of connecting wires connecting adjacent two of the metal wires, the hollow-out region is formed in a region between adjacent two connecting wires and two of the metal wires connected to both ends of the two connecting wires, and the metal wire has a curved shape.

3. The display apparatus according to claim 2, wherein the metal wire is corrugated in a direction perpendicular to the first substrate, the plurality of metal wires form corrugated surfaces, and the connecting wire is vertically connected between peak positions or valley positions of adjacent metal wires.

4. The display apparatus according to claim 2, wherein the metal wire is corrugated inclined with respect to the first substrate, the plurality of metal wires form corrugated surfaces, and the connecting wire is vertically connected between peak positions or valley positions of adjacent metal wires.

5. The display apparatus of claim 2, wherein the metal wire is in a zigzag shape that fluctuates in a direction perpendicular to the first substrate, the plurality of metal wires form sawtooth surfaces, and the connecting wire is vertically connected between tip positions or slot positions of adjacent metal wires.

6. The display apparatus of claim 2, wherein the metal wire is in a zigzag shape that fluctuates in a direction inclined with respect to the first substrate, the plurality of metal wires form sawtooth surfaces, and the connecting wire is vertically connected between tip positions or slot positions of adjacent metal wires.

7. The display apparatus of claim 2, wherein along a length direction of the metal wire, vertical distances from points of each of the metal wires to another of the metal wires are equal.

8. The display apparatus of claim 1, Wherein the second substrate is further coated with a black matrix, and the black matrix is arrange on one surface of the second substrate facing the first substrate.

9. The display apparatus of claim 1, wherein the first substrate is further provided with a conductive thin film layer configured to protect the metal wiring.

10. The display apparatus of claim 9, wherein the conductive film layer has a thickness greater than or equal to a thickness of the metal wiring.

11. The display apparatus of claim 9, wherein the metal wiring is etched in the conductive film layer.

12. The display apparatus of claim 2, wherein two end points of the metal wire defining each hollow-out region are respectively named as point A and point B, and a height of the point B is higher than a height of the point A; and the two connecting wires are respectively located at the point A and the point B of the metal wire; and the point A is a lowest point of a side edge of the metal wire and the point B is a highest point of the metal wire; thus an area of region defined by the two connecting wires and the two metal wires is largest.

13. Display apparatus, including:
a first substrate, wherein one side of the first substrate is a light-incident surface;
a second substrate arranged at and spaced apart from a side of the first substrate opposite to the light-incident surface;
a sealant adhesively and only arranged in periphery portions of the first substrate and the second substrate to seal the first substrate and the second substrate, wherein silicon ball particles or plastic ball particles are distributed in the sealant to support and maintain a liquid box formed by the first substrate and the second substrate; and
a metal wiring arranged on the other side of the first substrate, wherein a portion of the metal wiring corresponding to the sealant is arranged in a curved shape, the metal wiring is a non-planar structure with respect the first substrate, which is a wavy structure that undulates in a direction perpendicular to the first substrate;
wherein the metal wiring is provided with a hollow-out region which is configured to allow light to pass through to cure the sealant;
wherein a gate insulating layer is arranged on the other side of the first substrate, and at least a portion of the metal wiring other than those corresponding to the sealant is arranged in the gate insulating layer.

14. The display apparatus of claim 13, wherein the gate insulating layer has a thickness greater than a thickness of the metal wiring.

15. The display apparatus of claim 13, wherein the gate insulating layer has a length smaller than a length of the first substrate.

16. The display apparatus of claim 13, wherein the metal wiring comprises a plurality of metal wires spaced apart from each other and a plurality of connecting wires connecting adjacent two of the metal wires, the hollow-out region is formed in a region between adjacent two connecting wires and two of the metal wires connected to both ends of the two connecting wires, and the metal wire has a curved shape.

17. The display apparatus of claim 16, wherein each of the connecting wires has a thickness greater than a thickness of each of the metal wires.

18. The display apparatus of claim 16, wherein the connecting wires are integrally formed with the metal wires.

19. The display apparatus of claim 16, wherein the connecting wires are soldered to the metal wires.

20. A display device comprising a display host and a base configured to support the display host, the display host comprising:
a first substrate, wherein one side of the first substrate is a light-incident surface;
a second substrate arranged at and spaced apart from a side of the first substrate opposite to the light-incident surface;
a sealant adhesively and only arranged in periphery portions of the first substrate and the second substrate to seal the first substrate and the second substrate, wherein silicon ball particles or plastic ball particles are distributed in the sealant to support and maintain a liquid box formed by the first substrate and the second substrate; and
a metal wiring arranged on the other side of the first substrate, wherein the metal wiring is arranged in a curved shape, the metal wiring is a non-planar structure with respect the first substrate, which is a wavy structure that undulates in a direction perpendicular to the first substrate;
wherein the metal wiring is provided with a hollow-out region which is configured to allow light to pass through to cure the sealant.

* * * * *